(12) United States Patent
Jiang et al.

(10) Patent No.: US 6,693,356 B2
(45) Date of Patent: Feb. 17, 2004

(54) COPPER TRANSITION LAYER FOR IMPROVING COPPER INTERCONNECTION RELIABILITY

(75) Inventors: Qing-Tang Jiang, Austin, TX (US); Robert Tsu, Plano, TX (US); Kenneth D. Brennan, Austin, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/107,630

(22) Filed: Mar. 27, 2002

(65) Prior Publication Data

US 2003/0186543 A1 Oct. 2, 2003

(51) Int. Cl.[7] .................... H01L 23/52; H01L 29/40; H01L 21/4763
(52) U.S. Cl. .................. 257/767; 257/751; 257/753; 257/762; 438/653; 438/643; 438/627
(58) Field of Search ................ 257/486, 751, 257/E31.066, 753, 762, 767, 301; 438/627, 628, 649, 644, 653, 654, 514

(56) References Cited

U.S. PATENT DOCUMENTS 6,184,550 B1 * 2/2001 Van Buskirk et al. ...... 257/306
6,328,871 B1 * 12/2001 Ding et al. ................. 205/183
6,551,872 B1 * 4/2003 Cunningham ............... 438/225
6,570,257 B2 * 5/2003 Chen et al. ................. 257/762

* cited by examiner

Primary Examiner—Caridad Everhart
Assistant Examiner—Calvin Lee
(74) Attorney, Agent, or Firm—Peter K. McLarty; W. James Brady, III; Frederick J. Telecky, Jr.

(57) ABSTRACT

The structure and the fabrication method of an integrated circuit in the horizontal surface of a semiconductor body comprising a dielectric layer over said semiconductor body and a substantially vertical hole through the dielectric layer, the hole having sidewalls and a bottom. A barrier layer is positioned over the dielectric layer including the sidewalls within the hole and the bottom of the hole; the barrier layer is operable to seal copper. A copper-doped transition layer is positioned over the barrier layer; the transition layer has a resistivity higher than pure copper and is operable to strongly bond to copper and to the barrier layer, whereby electomigration reliability is improved. The remainder of said hole is filled with copper. The hole can be either a trench or a trench and a via.

11 Claims, 3 Drawing Sheets

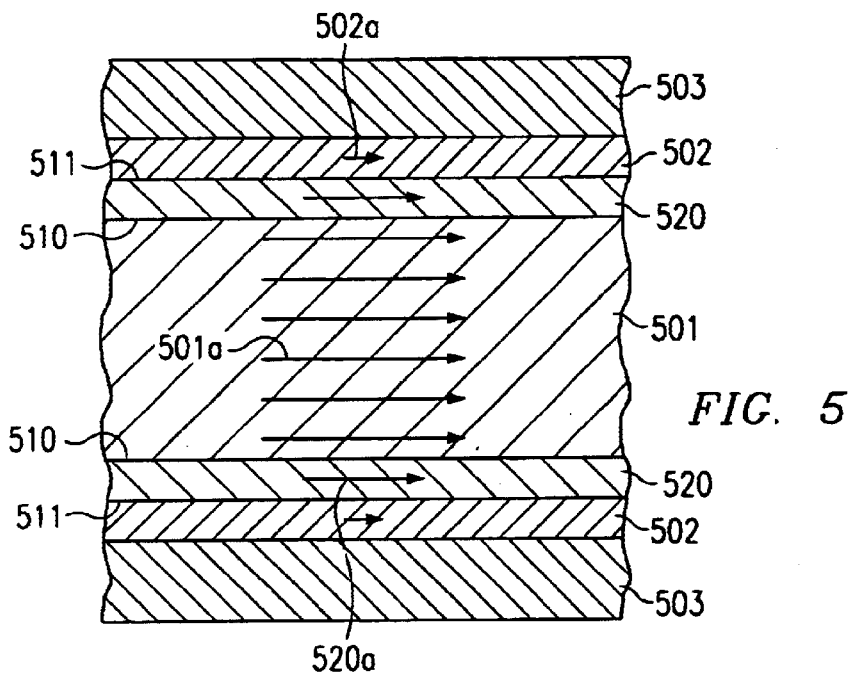
FIG. 5
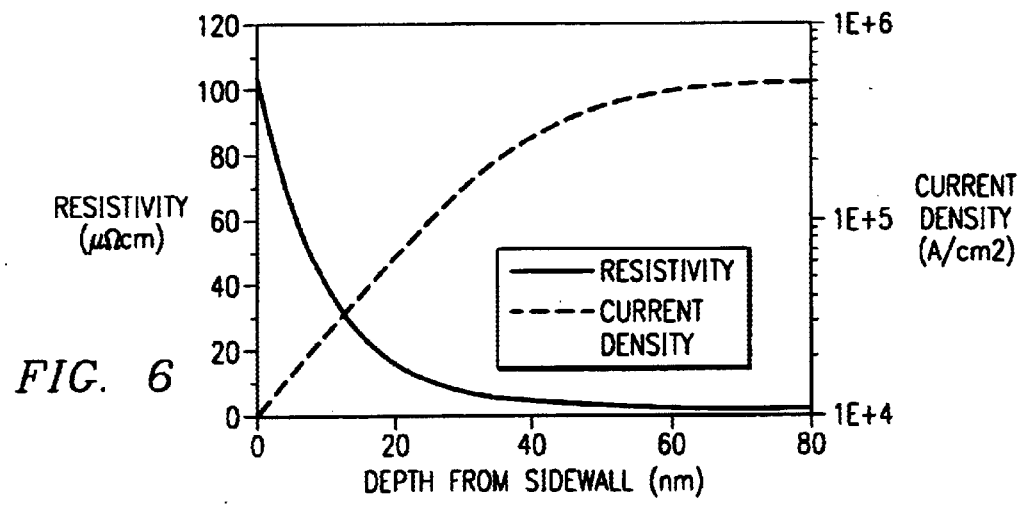
FIG. 6
| MEASUREMENTS | Cu/Zr | Cu/Sn |
|---|---|---|
| SOLUBILITY | ~0% | 0.2% |
| DIFFUSIVITY | HARDLY DIFFUSE IN Cu AT 400 °C | SLIGHTLY DIFFUSE IN Cu AT 400 °C |
| RESISTIVITY (1% Zr OR Sn IN Cu) $\mu\Omega$-cm | 19.8 | 5.4 |
FIG. 7

COPPER TRANSITION LAYER FOR IMPROVING COPPER INTERCONNECTION RELIABILITY

FIELD OF THE INVENTION

The present invention is related in general to the field of electronic systems and semiconductor devices, and more specifically to processes in integrated circuit fabrication aiming at reliable multi-level copper metallization.

DESCRIPTION OF THE RELATED ART

In the last few years, copper interconnection has been adapted to silicon integrated circuits due to its low resistance and high electromigration reliability compared to the traditional aluminum interconnection. Single-damascene and dual-damascene methods have been employed for the fabrication of copper interconnection. For multi-level copper interconnects using any of these two methods, improved electromigration reliability, especially improved lifetime of early failures have been reported, for example, in the recent article "A High Reliability Copper Dual-Damascene Interconnection with Direct-Contact Via Structure" (K. Ueno et al, IEEE Internat. Electron Devices Meeting 2000, December 10–13, pp. 265–268). In the technique described, the improvement in multi-level copper circuits has been achieved by making the copper contacts on the bottom of interconnecting vias barrier-free except for an ultra-thin adhesion layer.

In spite of progress such as described in that paper, in known technology many problems still remain related to the copper interconnection concept. For example, the copper traces have to be sealed by barrier layers in order to prevent copper migration into the silicon circuitry where copper atoms are known to offer energy levels for electron recombination/generation, acting as electron life-time killers. The same sealing barriers should protect the porous insulating layers of low dielectric constant (so-called low-k materials) against intruding atoms, which may initiate coalescence of micro-voids into larger voids.

As an additional example, in the preparation process of copper-filled vias, care has to be taken to prepare the via linings so that copper resistivity is prevented from increasing inordinately when the via diameter is shrinking. Some progress in this direction has been described recently in U.S. patent application Ser. No. 90/975,571, filed on Oct. 11, 2001 (Qing-Tang Jiang, "Reducing Copper Line Resistivity by Smoothing Trench and Via Sidewalls"). No attention has been given, however, to practical methods such as whether the via fabrication steps are cost-effective and simple enough for easy clean-up after via preparation.

It has been well documented that grain boundaries, dislocations, and point defects aid the material transport of electromigration (see, for example, S. M. Sze, "VLSI Technology", McGraw Hill, pp. 409–413, 1988). With the continuing trend of shrinking integrated circuit feature sizes, these unwelcome effects become ever more important, but no techniques have been disclosed for copper metallization to mitigate or avoid these effects.

An urgent need has, therefore, arisen for a coherent, low-cost method of fabricating copper metallizations and copper-filled via interconnections in single and especially dual damascene technology and, simultaneously, improve the degree of component reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The invention describes the structure and the fabrication method of an integrated circuit in the horizontal surface of a semiconductor body comprising a dielectric layer over said semiconductor body and a substantially vertical hole through the dielectric layer, the hole having sidewalls and a bottom. A barrier layer is positioned over the dielectric layer including the sidewalls within the hole and the bottom of the hole; the barrier layer is operable to seal copper. A copper-doped transition layer is positioned over the barrier layer; the transition layer has a resistivity higher than pure copper and is operable to strongly bond to copper and to the barrier layer, whereby electomigration reliability is improved. The remainder of said hole is filled with copper. The hole can be either a trench or a trench and a via.

The barrier deposition and etching method described by the invention is applicable to any dielectric layer, but especially to porous materials of low dielectric constants.

The barrier materials acceptable by the invention include many refractory metals, compounds such as dielectric metal carbides and nitrides, organic dielectric materials, and silicon dioxide. The barrier layers have a thickness in the range from 1 to 50 nm.

The copper-doped transition layer over the barrier layer include materials which provide an electrical resistivity high enough and a current density low enough to suppress electromigration. In some materials, the copper doping exhibits a gradient from low to high, and therefore the resistivity from high to low, from the barrier layer to the copper in the hole. The transition layers have a thickness in the range from 50 to 120 nm.

If the transition layer resistivity can be maintained low enough while still satisfying the basic requirement that copper plating can directly take place on the transition layer, then a copper seed layer deposition will not be necessary. Copper plating can follow right after the copper transition layer deposition.

As a technical advantage of the invention, the transition and barrier layers offer easy chemical clean-up after completing the selective removal process in order to selectively remove the transition and barrier layers from the bottom of the vias.

For the composite structure of a trench-level dielectric and a via-level dielectric, coupled by a middle stop layer, the process step of selectively removing the transition and barrier layers on the bottom of the via comprises a fine-tuned anisotropic plasma etching process. According to the invention, the etch step is designed to remove the (generally horizontal) transition and barrier portions on the bottom of the hole together with the (generally horizontal) transition and barrier portions on the middle stop layer and penetrate only partially into the middle stop layer. Consequently, the remaining stop layer continues to seal the porous dielectric material.

It is an aspect of the invention that the method is fully compatible with dual damascene process flow and deep sub-micron (0.18 $\mu$m and smaller) technologies.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 5 shows the top view of a copper line, embedded on copper-doped transition layers and barrier layers, illustrating the electrical current flow in the line and the transition layers to emphasize the suppression of electromigration.

FIG. 6 is a plot of resistivity and current density in the transition layer due to copper doping.

FIG. 7 compares diffusivity in copper of materials for the transition layer, illustrating layer stability.

DETAILED DESCRIPTION OF THE PREFERRED EMBODIMENTS

The present invention is related to U.S. patent application Ser. No. 09/863,687, filed on May 23, 2001 (Brennan et al., "Method for Sealing Via Sidewalls in Porous Low-k Dielectric Layers"); and Ser. No. 09/975,571, filed on Oct. 11, 2001 (Jiang, "Reducing Copper Line Resistivity by Smoothing Trench and Via Sidewalls").

Figure 1:
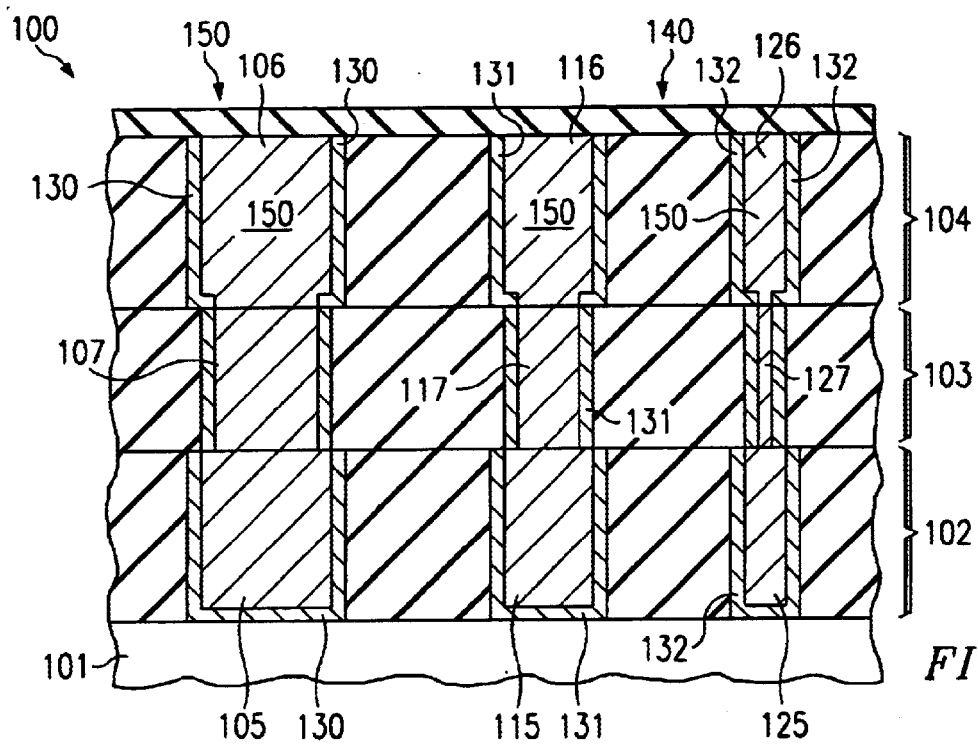
FIG. 1 illustrates schematic cross sections through copper filled trenches and vias in insulators to illustrate the effect of increasingly important interfaces due to shrinking feature sizes.

FIG. 1 is a schematic cross section through two-level integrated circuit (IC) metallization structure, generally designated 100. Over a semiconductor body 101 is formed a first intralevel dielectric layer 102, followed by an interlevel dielectric layer 103, and topped by a second intralevel dielectric layer 104. The dielectric material is a low-k material 140. A trench 105 has been etched in the first intralevel dielectric layer 102, another trench 106 has been etched in the second intralevel layer 104, and a via 107 has been etched in the interlevel dielectric layer 103. Both trenches 105 and 106 and the via 107 have been filled with copper 150 (trench 105 forming the first metallization level, and trench 106 forming the second metallization level). Because of the nature of the copper, the sidewalls of the trenches and the via have to be lined with a thin barrier layer 130 in order to prevent any out-diffusion out-drifting of copper into the dielectric material 140 (or into the semiconductor body 101). 160 is a top dielectric barrier, preferably a layer of silicon carbide or silicon carbo-nitride, or a stack of both layers.

In order to symbolize the trend for shrinking feature sizes, another trench 115 has been etched in the first intralevel dielectric layer 101; trench 115 has smaller cross section than trench 105. Likewise, trench 116, etched in the second intralevel dielectric layer 104, has a smaller cross section than trench 106. Also via 117, etched in the interlevel dielectric layer 103, has smaller cross section than via 107.

Again, both trenches 115 and 116 and the via 117 are filled with copper. Consequently, the needed barrier layer 131 is substantially the same as barrier layer 130.

The ongoing trend for linewidth miniaturization is indicated by the third set of trenches 125 and 126 and via 127 in FIG. 1. Again, barrier 132 is substantially the same as barriers 130 and 131. This miniaturization trend has two consequences for electromigration:

The current density in the metallization increases; and

The unchanged interface barrier/copper increases in importance relative to the shrinking copper line and via. The percentage of copper in the sidewall interface region increases as the linewidth decreases.

The drift velocity of migrating ions is proportional to the current density, the electrical resistivity, and the diffusivity, and inverse proportional to an exponential term containing the diffusion activation energy (see S. M. Sze, "VLSI Technology", p. 410, McGraw Hill 1988). The diffusivity is greatly determined by the presence of interfaces, grain boundaries, dislocation, etc. Consequently, the sidewall electromigration reliability of metal interconnections as illustrated in FIG. 1 becomes more important as the line and via dimensions decrease relative to the sidewall interface region.

Figure 2A:
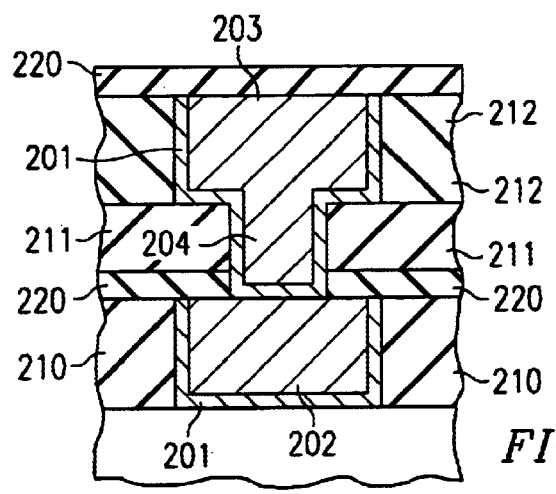
FIG. 2A shows a schematic cross section through copper-filled trenches and via, lined with barrier layers.
Figure 2B:
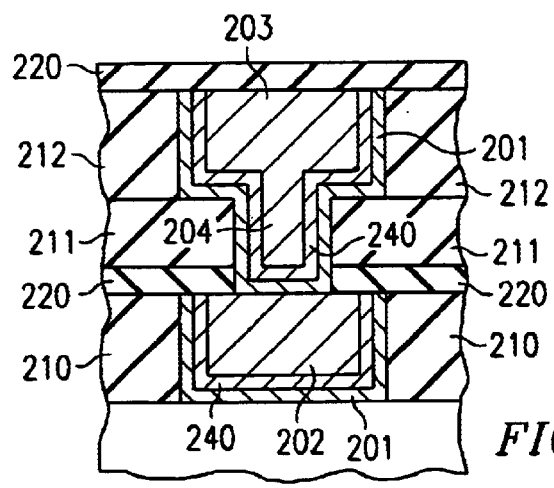
FIG. 2B shows a schematic cross section through copper-filled trenches and via, lined with copper-doped transition layers and barrier layers according to the invention.

The schematic cross section of FIG. 2A repeats the status of the present technology for copper metallization in order to compare it with FIG. 2B, which illustrates the solution according to the teachings of the present invention. In FIG. 2A as well as in FIG. 2B, a barrier layer 201 lines trench 202, trench 203 and via 204. Trenches 202 and 203, as well as via 204 are filled with copper. There are several options for the barrier layer:

The barrier layer is made of a refractory metal selected from a group consisting of titanium, tantalum, tungsten, molybdenum, chromium, and compounds thereof;

the barrier layer is made of an insulating dielectric compound selected from a group consisting of silicon carbon nitride, silicon carbide, titanium nitride, tantalum nitride, tungsten nitride, tungsten carbide, silicon nitride, titanium silicon nitride, and tantalum silicon nitride;

the barrier layer is made of an organic dielectric material.

Preferably, the barrier layer 201 has a thickness in the range from 1 to 50 nm. The barrier layer seals porous dielectric layers 210, 211 and 212 (low dielectric constants) so that micro-voids within said porous dielectric layers are prevented from coalescing into larger voids, and copper is prevented from migrating from said hole into said dielectric layers. The structures in FIGS. 2A and 2B further have dielectric layers 220, preferably made of silicon carbo-nitride, silicon nitride, or silicon carbo-oxide.

According to the invention, a transition layer 240 of copper-containing material lines the trenches 202 and 203 and the via 204. The transition layer provides an electrical resistivity high enough and a current density low enough to suppress electromigration originating at the copper-barrier interface. The transition layer is selected from a group of materials consisting of:

copper tantalum, copper magnesium, copper aluminum, copper silicon, copper chromium, copper beryllium, copper zirconium, copper nickel, copper zinc, copper silver, copper titanium, and copper palladium.

Preferred choices are copper zirconium and copper tin.

The transition layer has a thickness in the range 50 to 120 nm. Over this range, copper may be incorporated in a gradient fashion or in constant concentration.

Figure 3:
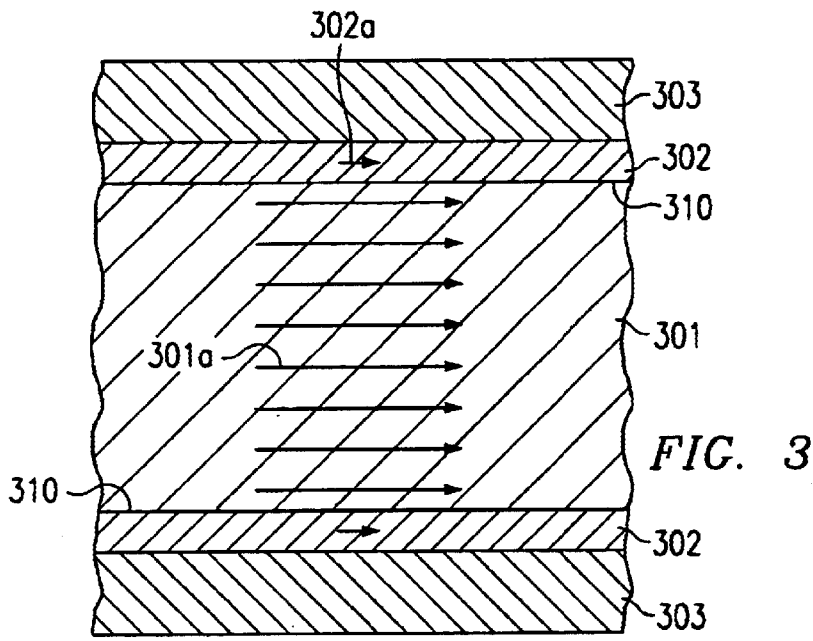
FIG. 3 shows the top view of a copper line, embedded in barrier layers and insulators, illustrating the electrical current flow in the line and the barrier to emphasize the origin of electromigration.

A comparison between the flow of electrical current through the copper metallization line in the presence of a copper-containing transition layer to the case without such transition layer, is schematically illustrated by a comparison between FIGS. 5 and 3. Both figures represent lengthwise cross sections through, or top views of, the metallization lines. In FIG. 3, the copper line is designated 301, with the arrows 301a schematically indicating the current strength and density (the length and density of the arrows 301a in FIG. 3 are not necessarily to be interpreted in a quantitative sense). The copper line 301 is surrounded by and embedded in barrier layer 302. In FIG. 3, the barrier layer consists of a refractory metal such as tantalum, which can carry a small amount of current, indicated by the small arrow 302a. If the barrier layer were an insulator such as tantalum nitride, no current would flow in the barrier layer. The barrier layers 302, in turn, are imbedded in isolation material 303.

For electromigration, the critical interface is the interface 310 between the copper line 301 with its good current-conducting property and the barrier layer 302 with its poor current-conducting capability. As discussed above, it is at this interface 310 where electromigration failures are likely to originate.

Figure 4A:
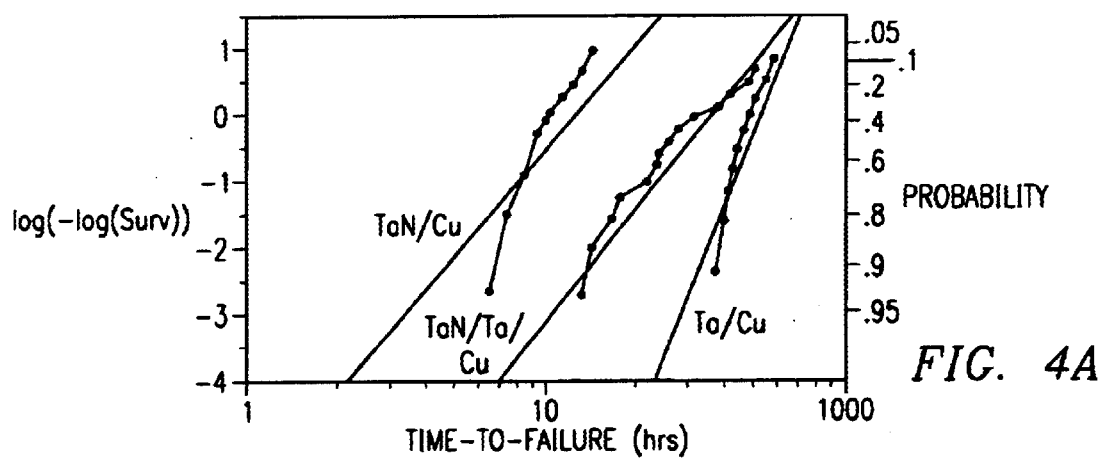
FIGS. 4A and 4B show Weibull plots with lifetime data for copper lines with barrier layers having different resistivities and current-carrying capabilities.
Figure 4B:
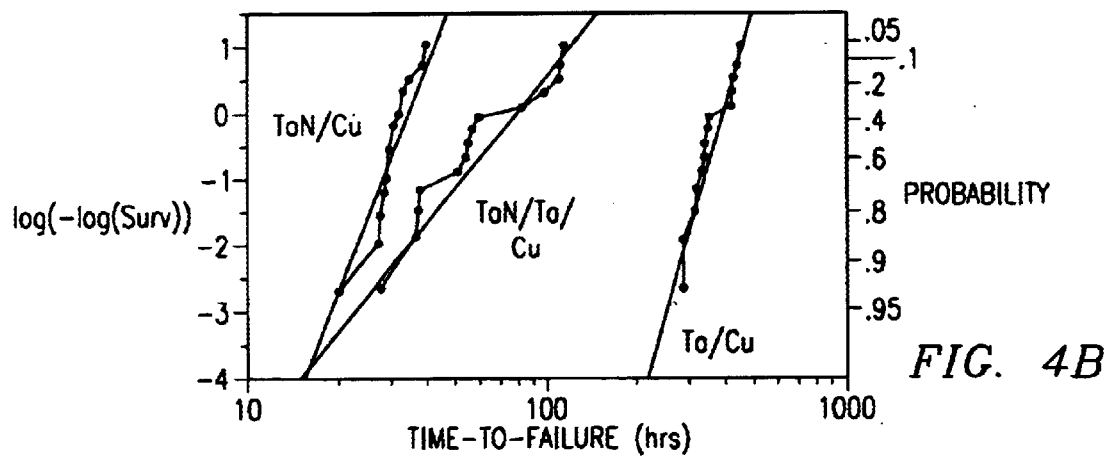

FIGS. 4A and 4B show measured data of the copper metallization lifetime as a function of the barrier material, or current-carrying capability of the barrier. Both figures represent Weibull plots of dual damascene samples at 325° C., in FIG. 4A for 0.35 µm line width and 1.6 mA/cm² current density, in FIG. 4B for 0.5 µm line width and 1.0 mA/cm² current density. Plotted are the log-log survival rates as a function of the time-to-failure (measured in hours). In both FIGS. 4A and 4B, the trend is clearly demonstrated that copper line lifetimes become the better the lower the resistivity of the barrier is. Copper samples with tantalum nitride barriers have clearly the poorest survival rate. Longer lifetimes are obtained in copper samples where a tantalum layer has been added to outermost tantalum nitride layer (bi-layer barrier samples). Clearly the best lifetimes are obtained with tantalum-on-copper samples, where the barrier layers exhibit the best electrical conductivity of the particular samples studied.

According to the invention, an additional layer is inserted between the copper line and the barrier layer, and the electrical conductivity of this transition layer is enhanced by "doping" (or alloying) the base metal with copper. FIG. 5, analogous to FIG. 3, is a schematic cross section through, or top view of, the copper line 501. The arrows 501a indicate schematically the current strength and density (the length and density of the arrows 501a are not necessarily to be interpreted in a quantitative sense). The copper line 501 is surrounded by and embedded in the copper transition layer 520. The intermediate length of arrows 520a represents a non-zero, preferably intermediate strength of the electrical current, although much reduced in comparison to the current in the copper line 501. Layer 520 consists of a material from the list quoted above. The copper transition layer is embedded in and surrounded by the barrier layer 502. It consists of a refractory metal, such as tantalum, which can carry a small amount of current, indicated by the small arrow 502a. If the barrier were an insulator such as tantalum nitride, no current would flow in the barrier layer. The barrier layers 502, in turn, are imbedded in isolation material 503.

For electromigration, the critical interface is the interface 510 between the copper line 501 with its good current-conducting property and the copper-doped transition layer 502 with its intermediate current-conducting capability. Experience has shown that at this interface 510 hardly any electromigration failures originate; consequently, the lifetime of devices having the copper-doped transition layer is dramatically increased.

The main reason for this improvement is the gradual increase of the current density, rather than the abrupt increase as in the sample illustrated in FIG. 3. FIG. 6 depicts the correlation of the resistivity (in $\mu\Omega$cm) as created by the copper doping and the resultant current density (in a/cm²), as a function of the depth (in nm) from the beginning 511 of the copper-doped transition layer (or sidewall).

The metal selection of the transition layer is greatly determined by the desire to retain the integrity of the transition layer and to prevent any gradual diminishing or shrinkage by out-diffusion, out-solution, or any other intermixing. Two examples, which basically fulfill this condition, are listed in FIG. 7 (the data are reproduced from the paper of C. P. Wang et al., IITC Conference, June 2001, pp. 86). As can be seen from this example, zirconium hardly diffuses in copper, even at 400° C., while tin slightly diffuses in copper @ 400° C. The addition of 1% zirconium in copper creates a significant resistivity (19.8 $\mu\Omega$cm); the resistivity of 1% tin in copper creates just 5.4 $\mu\Omega$cm. The data suggest that in principal both zirconium and tin are acceptable candidates for transition layer metals.

Another aspect in the selection of the transition layer metals is the need for perfect adhesion between the transition layer and the copper line, and also between the transition layer and the barrier layer. Besides the compatibility of the metals, the deposition methods are important. See method description below.

The process of fabricating an integrated circuit in the horizontal surface of a semiconductor body according to the invention comprises the steps of:

forming a dielectric layer over the semiconductor body;

etching a substantially vertical hole through the dielectric layer, the hole having a bottom and sidewalls;

depositing a barrier layer over the dielectric layer including the sidewalls within the hole and the bottom of the hole, the barrier layer operable to seal copper;

depositing a copper-doped transition layer over the barrier layer, thereby providing strong bonding to copper and improving electromigration reliability. Deposition techniques include physical vapor deposition, chemical vapor deposition, or atomic layer chemical mechanical deposition; and filling the remainder of the hole with copper. Techniques include copper plating without the need for copper seed layer deposition.

Further, the step of chemically-mechanically polishing the copper, transition layer and barrier layer may be added, thereby planarizing the surface.

Further, the step of selectively removing the barrier layer may be added, comprising an anisotropic plasma etching process, which removes the generally horizontal barrier portion on the bottom of the hole.

The process for completing an integrated circuit in the horizontal surface of a semiconductor body having metal lines according to the invention comprises the steps of:

forming an interlevel dielectric layer over the semiconductor body;

forming an intrametal dielectric layer over the interlevel dielectric layer;

etching a substantially vertical trench into the intrametal dielectric layer and a substantially vertical via into said interlevel dielectric layer;

depositing a barrier layer over the intrametal dielectric layer including within said trench and the via, the barrier layer operable to seal copper;

depositing a copper-doped transition layer over the barrier layer including within the trench and the via;

selectively removing the barrier layer and the transition layer from the bottom of the via, thereby exposing the metal line; and filling the remainder of the trench and the via with copper.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. An example is the fine-tuning of the anisotropic plasma etch to achieve specific side wall structures when the via diameter is scaled down with the shrinking feature sizes of the integrated circuit designs. It is therefore intended that the appended claims encompass any such modifications or embodiments.

We claim:

1. An integrated circuit in the horizontal surface of a semiconductor body comprising:

a dielectric layer over said semiconductor body;

a substantially vertical hole through said dielectric layer, said hole having sidewalls and a bottom;

a barrier layer over said dielectric layer including said sidewalls within said hole and said bottom of said hole, said barrier layer operable to seal copper;

a copper-doped transition layer with a gradient copper doping having a resistivity higher than pure copper over said barrier layer wherein said copper-doped transition layer is a material selected from the group consisting of copper titanium, copper magnesium, copper aluminum, copper silicon, copper chromium, copper beryllium, copper zirconium, copper nickel, copper zinc, copper silver, and copper tin; and the remainder of said hole filled with copper.

2. The circuit according to claim 1 wherein said hole comprises a trench.

3. The circuit according to claim 1 wherein said hole comprises a trench and a via.

4. The circuit according to claim 1 wherein said dielectric layer is made of a porous material of low dielectric constant.

5. The circuit according to claim 1 wherein said barrier layer is made of a refractory metal selected from a group consisting of titanium, tantalum, tungsten, molybdenum, chromium, and compounds thereof.

6. The circuit according to claim 1 wherein said barrier layer is made of an insulating dielectric compound selected from a group consisting of silicon carbon nitride, silicon carbide, titanium nitride, tantalum nitride, tungsten nitride, tungsten carbide, silicon nitride, titanium silicon nitride, and tantalum silicon nitride.

7. The circuit according to claim 1 wherein said barrier layer is made of an organic dielectric material.

8. The circuit according to claim 1 wherein said barrier layer has a thickness in the range from 1 to 50 nm.

9. The circuit according to claim 1 wherein said barrier layer seals said dielectric layer so that micro-voids within said porous dielectric layer are prevented from coalescing into larger voids, and copper is prevented from migrating from said hole into said dielectric layer.

10. The circuit according to claim 1 wherein said transition layer has a thickness in the range from 50 to 120 nm.

11. The circuit according to claim 1 wherein said transition layer provides an electrical resistivity high enough and a current density low enough to suppress electromigration.

* * * * *